United States Patent
Gardner et al.

[11] Patent Number: 6,130,164
[45] Date of Patent: Oct. 10, 2000

[54] SEMICONDUCTOR DEVICE HAVING GATE OXIDE FORMED BY SELECTIVE OXIDE REMOVAL AND METHOD OF MANUFACTURE THEREOF

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 08/825,029

[22] Filed: Mar. 26, 1997

[51] Int. Cl.[7] .................................................. H01L 21/316
[52] U.S. Cl. ...................... 438/694; 438/703; 438/769; 438/770; 438/774
[58] Field of Search .................................... 438/694, 703, 438/769, 770, 774

[56] References Cited

U.S. PATENT DOCUMENTS

| | | | |
|---|---|---|---|
| 4,764,481 | 8/1988 | Alvi et al. | 437/56 |
| 5,043,224 | 8/1991 | Jaccodine et al. | 428/446 |
| 5,264,396 | 11/1993 | Thakur et al. | 437/238 |
| 5,316,981 | 5/1994 | Gardner et al. | 437/235 |
| 5,334,556 | 8/1994 | Guldi | 437/248 |
| 5,362,685 | 11/1994 | Gardner et al. | 437/238 |
| 5,382,533 | 1/1995 | Ahmad et al. | 437/24 |
| 5,571,734 | 11/1996 | Tseng et al. | 437/40 |
| 5,591,681 | 1/1997 | Wristers et al. | 437/240 |
| 5,712,208 | 1/1998 | Tseng et al. | 438/770 |
| 5,846,888 | 12/1998 | Chapek et al. | 438/770 |
| 5,849,643 | 12/1998 | Gilmer et al. | 438/773 |
| 5,851,888 | 12/1998 | Gardner et al. | 438/301 |
| 5,913,149 | 6/1999 | Thakur et al. | 438/762 |

*Primary Examiner*—Charles Bowers
*Assistant Examiner*—Matthew Whipple

[57] ABSTRACT

A semiconductor device having a gate oxide layer formed by selective removal of the gate oxide layer and a process for manufacturing such a device is disclosed. A gate oxide layer is formed on a substrate. The gate oxide layer is selectively removed in a controlled ambient to reduce the thickness of the gate oxide layer. A gate electrode is disposed on the gate oxide layer. In accordance with one particular aspect of the process, the controlled ambient includes an $NF_3$ bearing gas, which is flowed over the gate oxide layer to remove portions of the oxide layer.

21 Claims, 4 Drawing Sheets

SEMICONDUCTOR DEVICE HAVING GATE OXIDE FORMED BY SELECTIVE OXIDE REMOVAL AND METHOD OF MANUFACTURE THEREOF

FIELD OF THE INVENTION

The present invention is directed generally to a semiconductor device and method of manufacture thereof, and more particularly to such a device and method having a gate oxide formed by selective oxide removal.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such siliconbased semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions. The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate oxide layer. The gate oxide layer is typically grown in active regions of the device. In order to obtain a high-quality gate oxide layer, the surface of the active area is often wet-etched to remove any residual oxide. The gate oxide layer is then grown slowly, typically through dry oxidation. It is important to carefully control the growth of the gate oxide layer because the thickness and uniformity of the gate oxide layer can significantly impact the overall operation of the device being formed. For example, the drain current in a MOS transistor is inversely proportional to the gate-oxide thickness at a given set of terminal voltages. Accordingly, it is normally desired to make the gate oxide as thin as possible, taking into consideration the oxide breakdown and reliability considerations of the process and technology being used.

The above described conventional techniques for forming gate oxide layers impose limitations on the minimum thickness of the gate oxide layer and on the ability to control the uniformity of the gate oxide layer. As the thresholds for minimum thickness and uniformity control are reached, the ability to further scale down the semiconductor devices is hindered.

SUMMARY OF THE INVENTION

Generally, the present invention relates to a semiconductor device having a gate oxide layer formed by selective removal of the gate oxide layer and a process for manufacturing such a device. Consistent with the present invention a semiconductor device is formed having a thin gate oxide layer disposed on a substrate of the device. A gate electrode is disposed on the gate oxide layer. In accordance with an aspect of the invention the thin gate oxide has a thickness of 40 to 45 angstroms or less.

In accordance with another aspect of the invention a semiconductor device having a gate oxide is fabricated using a process in which a gate oxide layer is formed on a substrate. A portion of the gate oxide layer is selectively removed in a controlled ambient to reduce the thickness of the gate oxide layer. A gate electrode is disposed on the gate oxide layer. In accordance with one particular aspect of the invention, the controlled ambient includes an $NF_3$ bearing gas, which is flowed over the gate oxide layer to remove portions of the oxide layer.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
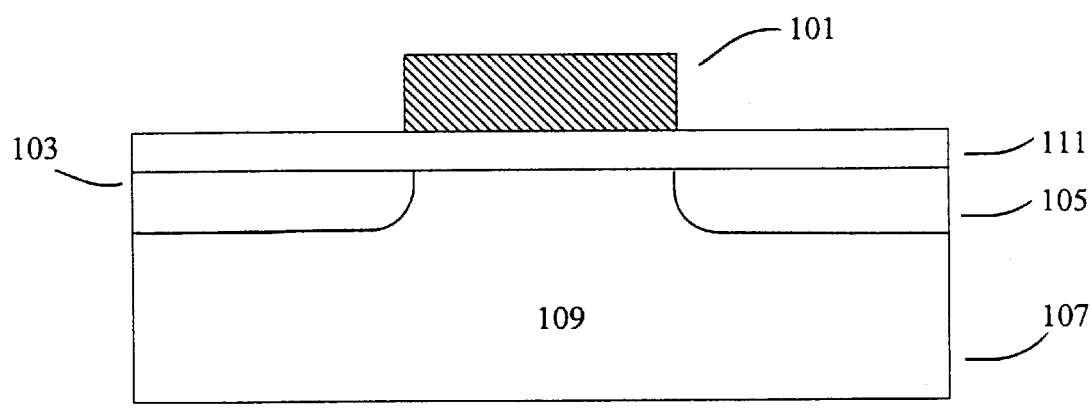
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which have a gate electrode disposed on a gate oxide. The invention has been found to be particularly advantageous in application environments where it is desirable to precisely control the formation of a gate oxide layer used in a MOS device. While the present invention is not so limited, an appreciation of various aspects of the invention is best gained through a discussion of various application examples of processes used to form such semiconductor devices.

Figure 2:
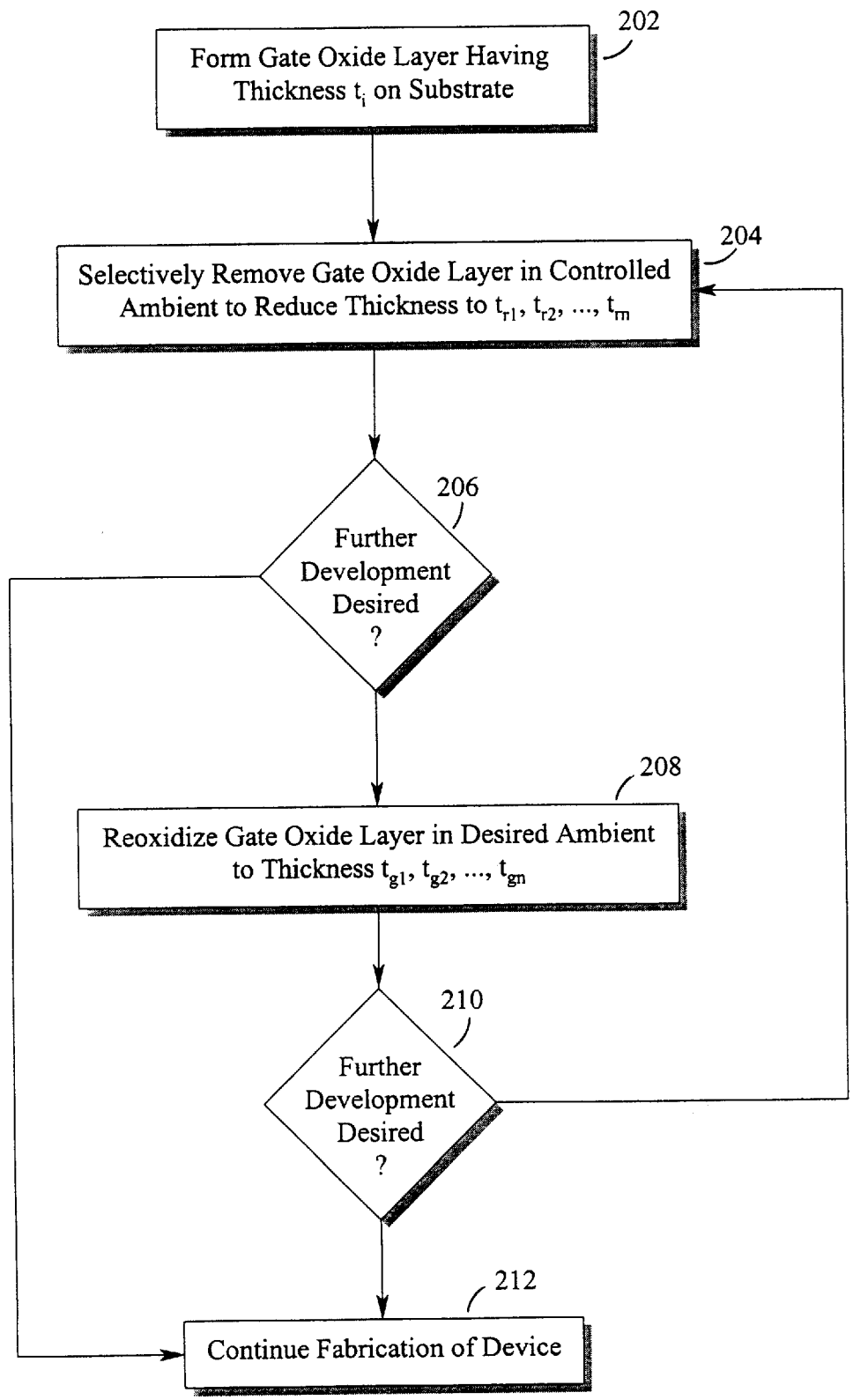
FIGS. 2 is a flow chart illustrating a fabrication process in accordance with an embodiment of the invention.

With reference to FIG. 2, a flow diagram illustrating a process for fabricating a semiconductor device in accordance with a particular embodiment of the present invention will be described. As indicated at block 202, a gate oxide layer having an initial thickness $t_i$ is formed on a silicon substrate. The gate oxide layer may have a thickness $t_i$ ranging from about 60 to 100 angstroms and may be formed using, for example, conventional growth or deposition techniques. However, the invention is not so limited.

The gate oxide layer may be, for example, a silicon oxide or a silicon nitride, formed in a number of different manners. In one embodiment, the gate oxide layer is formed by growing the oxide layer using conventional techniques, such as dry oxidation. While oxygen alone could be used to form the gate oxide layer, in accordance with one embodiment of the invention nitrogen is provided in the gate oxide layer to enhance the performance of the gate oxide layer as more fully described below. Nitrogen may be included in the gate oxide layer by, for example, growing the oxide layer in a nitrogen rich ambient.

In yet other embodiments, the gate oxide layer may be formed by implantation of an oxygen bearing species or by implantation of an oxygen bearing species and a nitrogen bearing species, as more fully described in U.S. patent application Ser. No. 08/760,723, entitled "Semiconductor Device Having A Thin Gate Oxide And Method Of Manufacture Thereof," filed Dec. 5,1996 and commonly assigned to the assignee of the present invention, the contents of which are herein incorporated by reference. As used herein the term "bearing species" includes the named element (e.g. oxygen) as well as any compounds including the named element (e.g. $O_2$, $NO_2$, etc.).

A portion of the gate oxide layer is selectively removed in a controlled ambient to reduce the thickness of the gate oxide layer to $t_{r1}=t_i-\Delta t$, as indicated in block 204. The controlled ambient generally includes a gas which removes the gate oxide layer without introducing significant amounts of matter which may degrade the performance of the gate oxide layer. For example, the controlled ambient may include a nitrogen and fluorine bearing gas, such as $NF_3$, for selectively removing a portion of the gate oxide layer and reducing the thickness thereof.

In one embodiment, the controlled ambient includes a $NF_3/N_2$ bearing gas, which is flowed over the gate oxide layer to reduce the thickness of the gate oxide layer to a thickness $t_i$ ranging from about 10 to 40 angstroms. In addition to reducing the thickness of the gate oxide layer, the $NF_3/N_2$ gas provides nitrogen in the gate oxide layer, which further enhances device performance, as will be discussed below. In alternate embodiments, the controlled ambient may include other substances, for example, a chlorine bearing species such as HCl, which may be incorporated in the gate oxide layer in addition to or in place of nitrogen.

The $NF_3$ and $N_2$ bearing gas may be flowed over the substrate in a controllable environment, such as a diffusion tube or a single wafer rapid thermal anneal chamber. The flowing may be carried out using standard equipment and techniques. The concentration ratio of the $NF_3/N_2$ bearing gas is selected to control the removal of the gate oxide layer in accordance with a desired thickness $t_i$ of the oxide gate layer. Concentration ratios of an $NF_3/N_2$ bearing gas ranging from 1 to 5% by volume would be suitable for many applications, for example.

Generally, using the above selective oxide removal process, the thickness and uniformity of the gate oxide layer can be controlled with greater precision than that of a conventionally grown gate oxide layer. Moreover, more reliable and thinner gate oxide layers may be formed using the above process as compared to conventional techniques.

Further development of the gate oxide layer may be performed to increase the uniformity and reliability of the gate oxide layer, as desired. This is illustrated at blocks 206, 208 and 210. The gate oxide layer can be oxidized in a desired ambient to increase the thickness of the oxide layer to a thickness $t_{g1}=t_{r1}+\Delta t$ and provide desired substances into the gate oxide layer, as indicated at blocks 206 and 208. For example, the gate oxide layer may be oxidized in an ambient including a nitrogen bearing species, such as $N_2$, $N_2O$, NO, etc., to increase the concentration of nitrogen in the gate oxide layer. Other substances which enhance device performance may be included in the ambient in addition to or in place of nitrogen. For example, chlorine and/or fluorine bearing species may be included in the ambient and incorporated in the gate oxide layer, as desired.

As indicated at blocks 210 and 204, a portion of the gate oxide layer can again be selectively removed in a controlled ambient to reduce the thickness of the gate oxide layer to $t_{r2}=t_{g1}-\Delta t$. This is done in a manner similar to that discussed above. It is noted that the thickness at iteration may vary, as desired. For example, $t_{r1}$ may be greater than, less than, or equal to $t_{r2}$, with the same holding true for subsequent iterations (e.g. $t_{rn}$) as well as thickness $t_g$.

The processes illustrated in blocks 204 to 210 may be repeated, as desired. Moreover, the final step may be a reduction step (block 204) or growth step (block 208) as desired. The particular number of iterations as well as the thicknesses $t_{r1} \ldots t_{rn}$ and $t_{g1} \ldots t_{gn}$ are selected in consideration of the desired characteristics of the resultant gate oxide layer. Generally, with each iteration, the reliability and uniformity of the gate oxide layer can be increased. For example, with each iteration additional concentrations of previously introduced substances may be incorporated into the gate oxide layer.

In addition, various concentration profiles in the gate oxide layer may be achieved. This can be done, for example, by varying the type and/or concentration of substances in the controlled ambient as well as by controlling the different thickness at each iteration. For example, it may be desirable to have a relatively high concentration of fluorine near the gate oxide-substrate interface and a relatively high concentration of nitrogen near the gate-oxide-gate electrode interface. This may be done by reducing a gate oxide to a thickness $t_{r1}$ in a fluorine bearing ambient, reoxidizing the substrate, and reducing the gate oxide layer to a thickness $t_{r2}$ in a nitrogen bearing ambient, where $t_{r2}>t_{r1}$.

When the processing illustrated in blocks 204 and 208 is completed, fabrication of other aspects of the device is performed, as illustrated at blocks 206, 210, and 212. For example, gate electrodes may be formed on the gate oxide layer using well-known techniques, such as masking and etching a standard polysilicon gate electrode layer.

As noted above, using a selective oxide layer removal process to form the gate oxide layer of such a semiconductor device has a number of advantages. The thickness and uniformity of the gate oxide layer can be controlled with greater precision than that of a conventionally grown gate oxide layer. This allows for the formation of more reliable and thinner gate oxides than can be formed using conventional techniques. For example, reliable and relatively thin gate oxide layers having a thickness, for example, of 40 to 45 angstroms or less may be formed.

Another advantage of the above-described fabrication process results from the presence of nitrogen in the gate oxide. The presence of nitrogen in the gate oxide layer improves the reliability and characteristics of the ultimately produced semiconductor device. For example, nitrogen in the gate oxide of a semiconductor MOS device serves to prevent the doping agent in the gate electrode (e.g. boron atoms in a PMOS device) from diffusing through the thin gate oxide layer and into the channel region. Another advantage of using nitrogen in the fabrication process results when extremely thin gate oxide layers are formed. In this instance, the nitrogen will tend to extend into the gate electrode polysilicon layer improving device reliability and reducing dopant diffusion.

Yet another advantage of the above-described fabrication process results from the presence of fluorine and/or chlorine in the gate oxide. The presence of fluorine and/or chlorine in the gate oxide layer improves the reliability and characteristics of the ultimately produced semiconductor device. For example, fluorine in the gate oxide of a semiconductor MOS device serves to suppress hot carrier injection of electrons into the gate oxide or gate electrode.

Figure 3A:
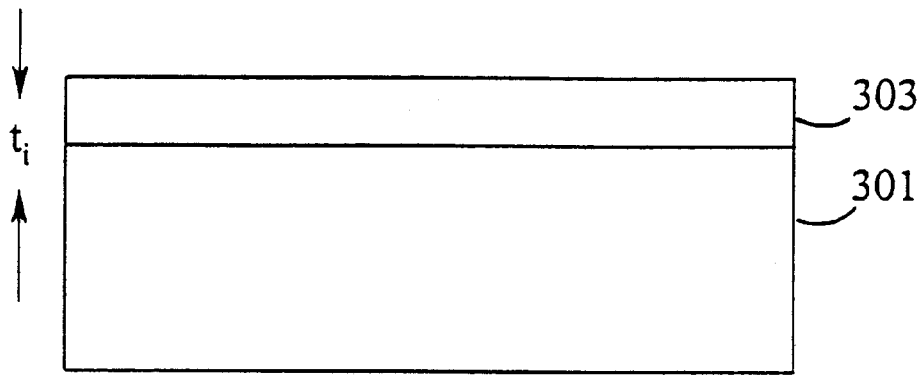
FIGS. 3A through 3F pictorially illustrate an exemplary fabrication process in accordance with one embodiment of the invention.

With reference to FIGS. 3A through 3F, a process for fabricating a semiconductor device in accordance with a particular embodiment of the present invention will be described. In FIG. 3A, a gate oxide layer 303 having an initial thickness $t_i$ is formed on a silicon substrate 301. Generally, the gate oxide layer 303 is formed in a manner as discussed above with respect to block 202 of FIG. 2. For example, the gate oxide layer 303 may be grown in a nitrogen bearing ambient to a thickness $t_i$ ranging from about 60 to 100 angstroms.

Figure 3B:
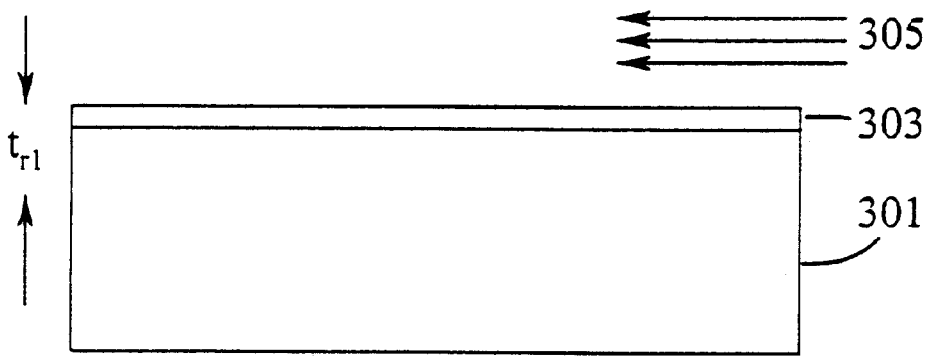

A portion of the gate oxide layer 303 is selectively removed in a controlled ambient to reduce the thickness of the gate oxide layer to $t_{r1}$. The resultant structure is illustrated in FIG. 3B. As discussed above, the controlled ambient generally includes a gas material which removes the gate oxide layer without introducing significant amounts of matter which may degrade the performance of the resultant device. For example, the controlled ambient may include an $NF_3/N_2$ gas in a ratio of 1 to 5 percent by volume, which is flowed (as illustrated by arrows 305) over the gate oxide layer 303, as discussed above. The thickness of the gate oxide layer may, for example, be reduced to a thickness $t_{r1}$ ranging from about 10 to 40 angstroms, using this technique.

Figure 3C:
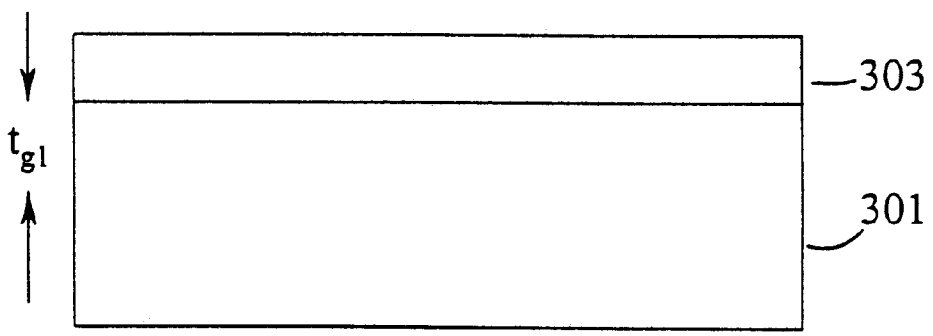

In the illustrated embodiment, the gate oxide layer 303 is further processed by oxidizing the oxide layer in a nitrogen bearing ambient. The resultant structure is illustrated in FIG. 3C. The nitrogen bearing ambient may include one or more nitrogen bearing species, such as NO, $N_2$, $N_2O$, etc. This provides an increased nitrogen concentration in the gate oxide layer 303 and increases the thickness of the oxide layer to a thickness $t_{g1}$ ($t_{g1} > t_{r1}$). The concentration of nitrogen in the ambient is selected based on the desired nitrogen concentration in the gate oxide layer 303. In alternate embodiments, substances, in addition to or in place of nitrogen, may be included in the ambient 309 for incorporation into the gate oxide layer, as discussed above.

Figure 3D:
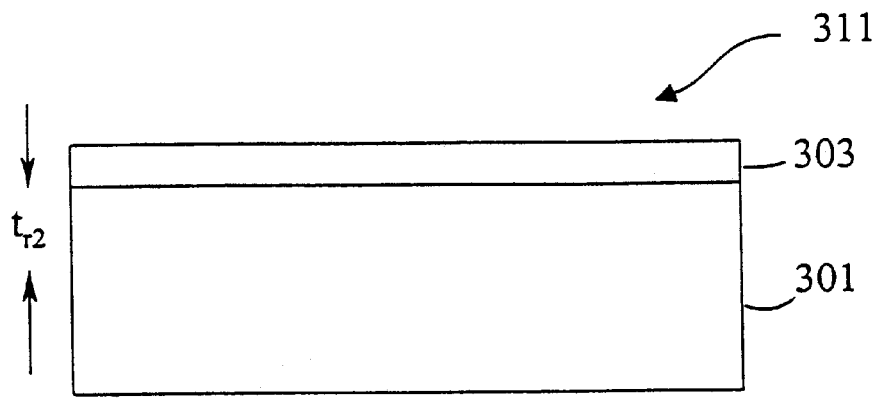

A portion of the gate oxide layer 303 is again selectively removed in a controlled ambient 311 to reduce the thickness of the gate oxide layer 303 to a thickness $t_{r2}$, as illustrated in FIG. 3D. This may be done by, for example, using an $NF_3$ and $N_2$ bearing gas, in a similar manner as that discussed above with respect to block 204 of FIG. 2. The thickness $t_{r2}$ may, for example, range from 10 to 45 angstroms or less. A thickness $t_{r2}$ ranging from 35 to 45 angstroms would be suitable for many applications.

Figure 3E:
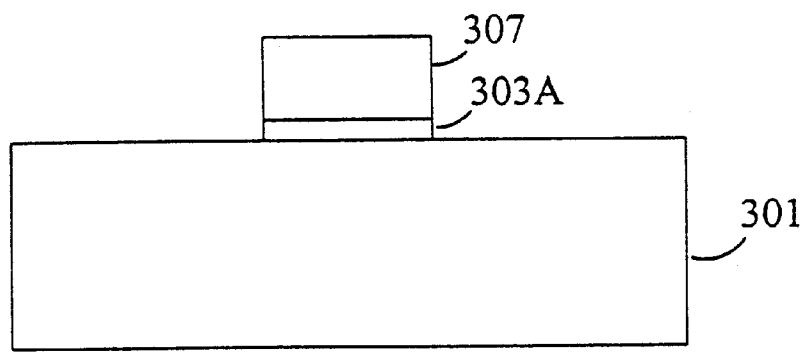
Figure 3F:
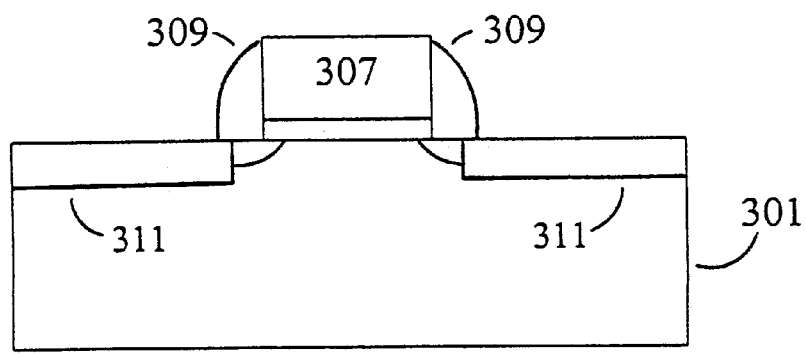

Gate electrodes (only one of which is shown) may then be formed on the gate oxide layer 303, as illustrated in FIG. 3E. The gate electrode 307 may be formed using well-known techniques, such as masking and etching a standard polysilicon gate electrode layer. The process will vary, as is known in the art, depending on the ultimately desired structure of the semiconductor device being formed. The structure depicted in FIG. 3E may be processed into a number of different structures. An example of lightly doped drain (LDD) MOS device manufactured in accordance with the present invention is illustrated in FIG. 3F. The LDD MOS device includes a gate oxide 303A and a gate electrode 307 processed in the manner described above. The device further includes LDD source/drain regions 311, sidewall spacers 309, and a silicide layer 313. The LDD device may be formed using known techniques to obtain the ultimate structural characteristics desired.

While the process shown in FIGS. 3A–3F illustrates a three step (one and one-half iterations) process including two reduction steps and one oxidation step, additional or fewer steps may be performed, as discussed above.

Forming a gate oxide layer of a semiconductor device using the above process has a number of advantages. As discussed above, the thickness and uniformity of the gate oxide layer can be controlled with greater precision than that of a conventionally grown gate oxide layers. This allows for more reliable and thinner semiconductor devices. In addition, the presence of nitrogen and, in some embodiments, fluorine and/or chlorine in the gate oxide layer, further improves the reliability of the gate oxide layer and enhances device performance. The characteristics of the gate oxide may be further enhanced by using the above-process to vary the concentration profiles of substances in the gate oxide, as discussed above.

The present invention is applicable to fabrication of a number of different devices where reliable and uniform gate oxide layers and/or the associated advantages obtained there from are desired. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A process of forming a semiconductor device, comprising:

forming a gate oxide layer having a thickness on a surface of a substrate; and selectively removing a portion of the gate oxide layer in a controlled ambient, having a gas including nitrogen and flourine, to reduce the thickness of the gate oxide layer.

2. The process of claim 1, wherein the gate oxide layer is formed from silicon dioxide.

3. The process of claim 1, wherein the gate oxide layer includes a nitrogen bearing species.

4. The process of claim 1, wherein forming the gate oxide layer includes growing an oxide on the substrate.

5. The process of claim 1, wherein the selectively removing the portion of the gate oxide layer includes flowing the gas over the gate oxide layer.

6. The process of claim 1, wherein nitrogen and fluorine are incorporated in the gate oxide layer via the gas.

7. The process of claim 1, wherein the gas includes $NF_3$.

8. The process of claim 7, wherein the gas includes $N_2$.

9. The process of claim 8, wherein the gas includes $NF_3$ and $N_2$ at a ratio of about 1 to 5% by volume.

10. The process of claim 1, further including oxidizing the substrate in a controlled ambient after removing the portion of the gate oxide layer so as to increase the thickness of the gate oxide layer and increase the concentration of a substance in the gate oxide layer.

11. The process of claim 10, wherein the substance includes a nitrogen bearing species.

12. The process of claim 10, wherein the substance includes a chlorine bearing species.

13. The process of claim 10, further including repeating the process of selectively removing a portion of the gate oxide layer.

14. The process of claim 13, further including repeating the process of oxidizing the substrate in a controlled ambient.

15. The process of claim 10, wherein the substance includes a nitrogen bearing species and a chlorine bearing species.

16. The process of claim 15, wherein nitrogen, chlorine and fluorine are incorporated in the gate oxide layer via the gas and the controlled ambient.

17. The process of claim 12, wherein the chlorinebearing species includes HCl.

18. The process of claim 1, wherein the thickness initially ranges from 60 to 100 angstroms and is selectively reduced in the controlled ambient to a range from 10 to 40 angstroms.

19. The process of claim 5, wherein the thickness, which initially ranges from 60 to 100 angstroms, is selectively reduced in the controlled ambient to a range from 10 to 40 angstroms, and is increased to a range from 35 to 45 angstroms by oxidation.

20. The process of claim 1, further including forming one or more gate electrodes on the gate oxide layer.

21. A process of forming a semiconductor device, comprising:

forming a gate oxide layer having an initial thickness $t_i$ on a surface of a substrate;

selectively removing a portion of the gate oxide layer in a first controlled ambient, having a gas including nitrogen and flourine, to reduce the gate oxide layer to a thickness $t_{r1}$; and oxidizing the substrate, including the gate oxide layer in a second controlled ambient to increase the gate oxide layer to a thickness $t_{g1}$.

* * * * *

UNITED STATES PATENT AND TRADEMARK OFFICE
CERTIFICATE OF CORRECTION

PATENT NO.    : 6,130,164
DATED         : October 10, 2000
INVENTOR(S)   : Gardner et al.

It is certified that error appears in the above-identified patent and that said Letters Patent is hereby corrected as shown below:

<u>Column 6,</u>
Line 62 "flourine" should read -- fluorine --.

<u>Column 8,</u>
Line 4, "chlorinebearing" should read -- chlorine bearing --.
Line 23, "flourine" should read -- fluorine --.

Signed and Sealed this

Sixth Day of August, 2002

Attest:

Attesting Officer

JAMES E. ROGAN
*Director of the United States Patent and Trademark Office*